United States Patent
Kim

(10) Patent No.: US 8,400,196 B2
(45) Date of Patent: Mar. 19, 2013

(54) PHASE CORRECTION CIRCUIT FOR MULTI-PHASE SIGNALS WITH SKEW DETECTION

(75) Inventor: Kwan Dong Kim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 125 days.

(21) Appl. No.: 12/981,468

(22) Filed: Dec. 29, 2010

(65) Prior Publication Data

US 2011/0291722 A1 Dec. 1, 2011

(30) Foreign Application Priority Data

May 31, 2010 (KR) .................. 10-2010-0051325

(51) Int. Cl.
*H03L 7/06* (2006.01)

(52) U.S. Cl. .................. 327/156; 327/3; 327/161

(58) Field of Classification Search .............. 327/3, 156, 327/161
See application file for complete search history.

(56) References Cited

U.S. PATENT DOCUMENTS

| 6,043,694 | A | 3/2000 | Dortu |
| 6,137,328 | A | 10/2000 | Sung |
| 2004/0091073 | A1* | 5/2004 | Smith et al. .................. 375/355 |
| 2011/0156757 | A1* | 6/2011 | Hayashi .......................... 327/3 |

FOREIGN PATENT DOCUMENTS

| KR | 100232018 B1 | 9/1999 |
| KR | 1020020009435 A | 2/2002 |
| KR | 1020080014392 A | 2/2008 |
| KR | 1020080044543 A | 5/2008 |
| KR | 1020080082450 A | 9/2008 |
| KR | 1020090117552 A | 11/2009 |

* cited by examiner

*Primary Examiner* — John Poos

(74) *Attorney, Agent, or Firm* — William Park & Associates Ltd.

(57) ABSTRACT

A phase correction circuit includes a skew detection unit configured to generate first skew detection signals and second skew detection signals by comparing multi-phase signals with one another, a phase control signal generation unit configured to generate a plurality of phase control signals by combining the first skew detection signals with the second skew detection signals, and a phase adjustment unit configured to delay the multi-phase signals by delay time corresponding to the plurality of phase control signals.

12 Claims, 5 Drawing Sheets

PHASE CORRECTION CIRCUIT FOR MULTI-PHASE SIGNALS WITH SKEW DETECTION

CROSS-REFERENCES TO RELATED APPLICATION

The present application claims priority under 35 U.S.C. §119(a) to Korean application number 10-2010-0051325, filed on May 31, 2010, in the Korean Intellectual Property Office, which is incorporated herein by reference in its entirety.

BACKGROUND

1. Technical Field

The present invention relates generally to a semiconductor circuit, and more particularly to a phase correction circuit.

2. Related Art

A semiconductor circuit, for example, a dynamic random access memory (DRAM), uses a clock signal as a reference signal for a read or write operation.

Specifically, the standard for graphic DRAMs, for example, GDDR5 DDR SDRAMs, specifies use of multi-phase signals (e.g., 4-phase clock signals).

The 4-phase clock signals may be generated by separating the phases of 2-phase clock signal provided externally.

In a graphic DRAM, a phase separator separates the phases of a 2-phase clock signal received through a receiver and generates 4-phase clock signals.

When the duty ratio of an externally provided 2-phase clock signal is exactly 50:50, any two of the 4-phase clock signals generated by separating the phases of the 2-phase clock signal would have the phase difference of exact 90° therebetween.

However, when there is a skew in the duty ratio of the 2-phase clock signal, a phase skew will occur in the 4-phase clock signals ICLK, QCLK, ICLKB, QCLKB as illustrated in FIG. 1 although the duty of each of the 4-phase clock signals is maintained constant.

That is, among the 4-phase clock signals ICLK, QCLK, ICLKB, QCLKB, the phases of ICLK and ICLKB are opposite to each other or have a phase difference of 180° therebetween, and the phases of QCLK and QCLKB also have a phase difference of 180° therebetween. However, the signals ICLK and QCLK do not have a phase difference of 90° therebetween.

As described above, when a phase skew occurs in the 4-phase clock signals, the set up margin or hold margin of a circuit that receives or transmits data using the 4-phase clock signals may be reduced.

SUMMARY

A phase correction circuit capable of accurately correcting a phase difference between multi-phase signals to a target value is described herein.

In one embodiment of the present invention, a phase correction circuit includes: a skew detection unit configured to generate first skew detection signals and second skew detection signals by comparing multi-phase signals with one another; a phase control signal generation unit configured to generate a plurality of phase control signals by combining the first skew detection signals with the second skew detection signals; and a phase adjustment unit configured to delay the multi-phase signals by delay time corresponding to the plurality of the phase control signals.

In another embodiment of the present invention, a phase correction circuit includes: a skew detection unit configured to generate first skew detection signals and second skew detection signals by sampling a sequentially delayed second phase signal on a basis of a first phase signal of 4-phase signals and sampling a sequentially delayed first phase signal on a basis of a third phase signal of the 4-phase signals; a phase control signal generation unit configured to generate phase control signals by combining the first skew detection signals with the second skew detection signals; and a phase adjustment unit configured to correct a phase difference between the 4-phase signals by delaying the first phase signal and a fourth phase signal by delay time corresponding to the phase control signals.

BRIEF DESCRIPTION OF THE DRAWINGS

Features, aspects, and embodiments are described in conjunction with the attached drawings, in which.

DETAILED DESCRIPTION

Hereinafter, a phase correction circuit according to the present invention will be described below with reference to the accompanying drawings through exemplary embodiments.

The general technical principles according to exemplary embodiments of the present invention are described below.

Figure 1:
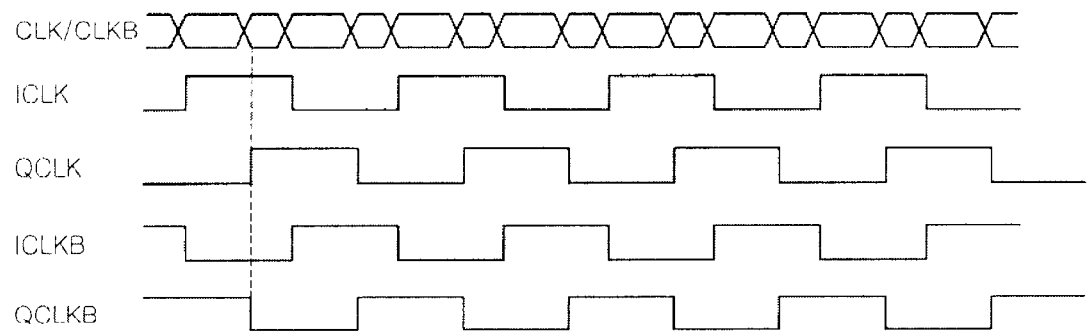
FIG. 1 is a waveform diagram illustrating the occurrence of a skew in multi-phase signals according to the conventional art.

When the duty ratio of an external clock signals CLK and CLKB is not 50:50 as in FIG. 1, a skew would occur between the signals ICLK and QCLK and between the signals ICLKB and QCLKB. However, a skew would not occur between the signals ICLK and ICLKB and between the signals QCLK and QCLKB, as the paired signals have inverted phases with respect to each other.

In order to accomplish the phase difference between the 4-phase clock signals ICLK, QCLK, ICLKB, QCLKB to a target value, the phase of one of the signals ICLK and QCLK may need to be adjusted.

In an embodiment of the invention, the phase adjustment is accomplished by allowing the delay time of either ICLK or QCLK to be different from the delay time of the other one of ICLK and QCLK.

Furthermore, ICLKB and ICLK are adjusted to have the same delay time, and QCLKB and QCLK are adjusted to have the same delay time.

Figure 2:
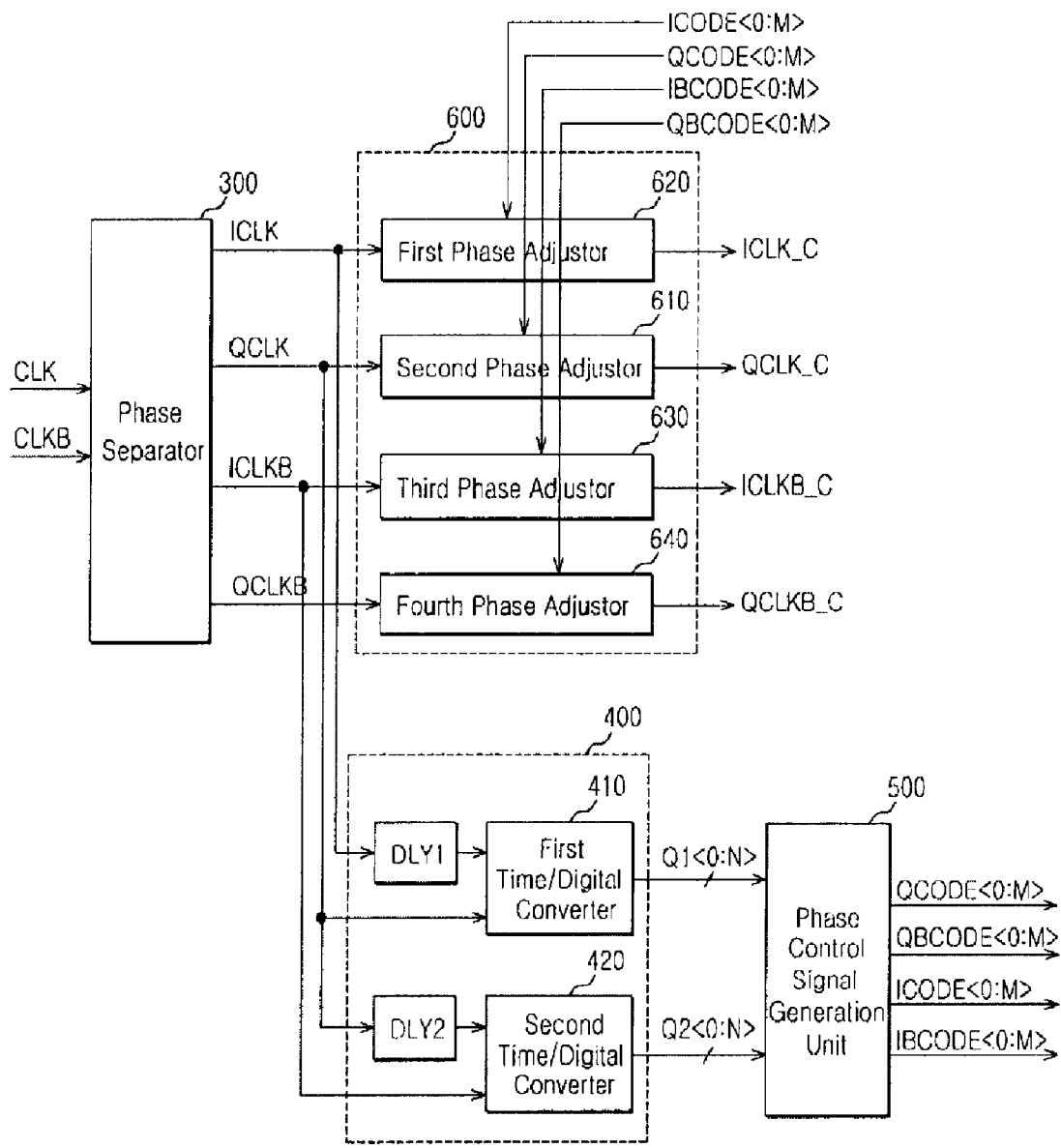
FIG. 2 is a block diagram of a phase correction circuit according to an embodiment of the present invention.

Referring to FIG. 2, an example in which a phase correction circuit 100 configured to adjust the delay time of the signal QCLK will be described below.

Shown in FIG. 2, the phase correction circuit 100 according to an embodiment of the invention includes a skew detection unit 400, a phase control signal generation unit 500, and a phase adjustment unit 600.

The skew detection unit 400 is configured to generate first skew detection signals Q1<0:N> and second skew detection signals Q2<0:N> by comparing multi-phase signals, that is, 4-phase clock signals ICLK, QCLK, ICLKB, and QCLKB.

The 4-phase clock signals ICLK, QCLK, ICLKB, and QCLKB are generated by separating the phases of the external clock signals CLK and CLKB in a phase separator 300.

The skew detection unit 400 is configured to generate the first skew detection signals Q1<0:N> and the second skew detection signals Q2<0:N> by comparing each one of the 4-phase clock signals ICLK, QCLK, ICLKB, QCLKB with both another signal of ICLK, QCLK, ICKB, and QCLKB with an advanced phase and another signal of ICLK, QCLK, ICKB, and QCLKB with a delayed phase.

The skew detection unit 400 includes a first time/digital converter 410, a second time/digital converter 420, a first delay section DLY1, and a second delay section DLY2.

The first time/digital converter 410 is configured to generate the first skew detection signals Q1<0:N> by sampling the clock signal ICLK, which is delayed through the first delay section DLY1, on the basis of the clock signal QCLK.

The second time/digital converter 420 is configured to generate the second skew detection signals Q2<0:N> by sampling the clock signal QCLK, which is delayed through the second delay section DLY2, on the basis of the clock signal ICLKB.

Since the first delay section DLY1 and the second delay section DLY2 are provided in order to improve the sampling resolution of the first time/digital converter 410 and the second time/digital converter 420, it is also possible to embody the present invention even without the first delay section DLY1 and the second delay section DLY2.

The phase control signal generation unit 500 is configured to generate phase control signals QCODE<0:M>, QBCODE<0:M>, ICODE<0:M>, and IBCODE<0:M> by combining the first and second skew detection signals Q1<0:N>, Q2<0:N>.

The phase control signal generation unit 500 is configured to encode the difference of the first skew detection signals Q1<0:N> and the second skew detection signals Q2<0:N> and output the encoded signals as the phase control signals QCODE<0:M>, QBCODE<0:M>, ICODE<0:M> and IBCODE<0:M>.

The phase control signals QCODE<0:M> are obtained by encoding the difference of the first skew detection signals Q1<0:N> and the second skew detection signals Q2<0:N>, and the phase control signals QBCODE<0:M> would have the same value as the phase control signals QCODE<0:M>. The phase control signals ICODE<0:M> would have arbitrary values as preset signals, and the phase control signals IBCODE<0:M> would have the same value as the phase control signals ICODE<0:M>.

The phase control signal generation unit 500 may include a register for storing the phase control signals IBCODE<0:M> and ICODE<0:M>. Also, the phase control signals IBCODE<0:M> and ICODE<0:M> may also be stored in a separate storage circuit.

The phase adjustment unit 600 is configured to output phase adjustment signals ICLK_C, QCLK_C, ICLKB_C, and QCKLB_C having the corrected phases of the 4-phase clock signals ICLK, QCLK, ICLKB, and QCLKB by delaying the 4-phase clock signals ICLK, QCLK, ICLKB, and QCKLB by delay time corresponding to the phase control signals QCODE<0:M>, QBCODE<0:M>, ICODE<0:M>, and IBCODE<0:M>.

The phase adjustment unit 600 includes first to fourth phase adjusters 610, 620, 630, and 640.

Figure 3:
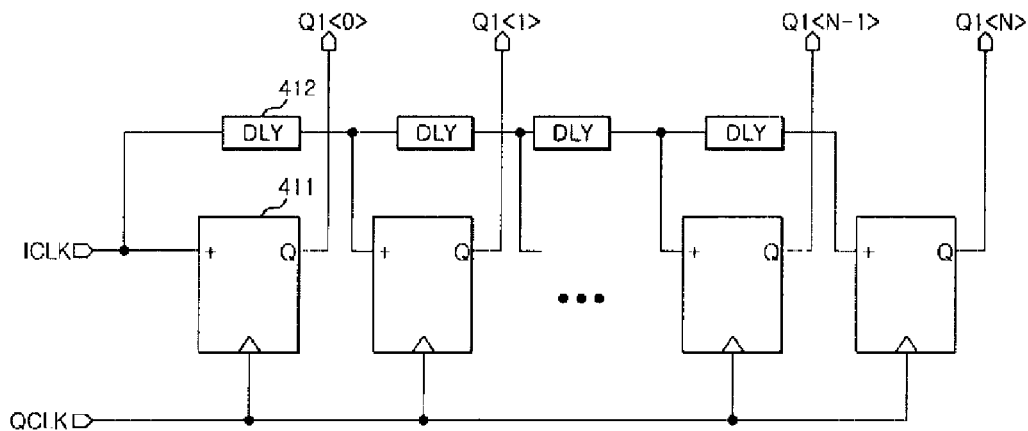
FIG. 3 is a circuit diagram of the time/digital converter illustrated in FIG. 2.

Referring to FIG. 3, the first time/digital converter 410 includes a plurality of delayers DLY (412) and a plurality of samplers 411. Each sampler 411 may include a flip-flop.

Figure 4:
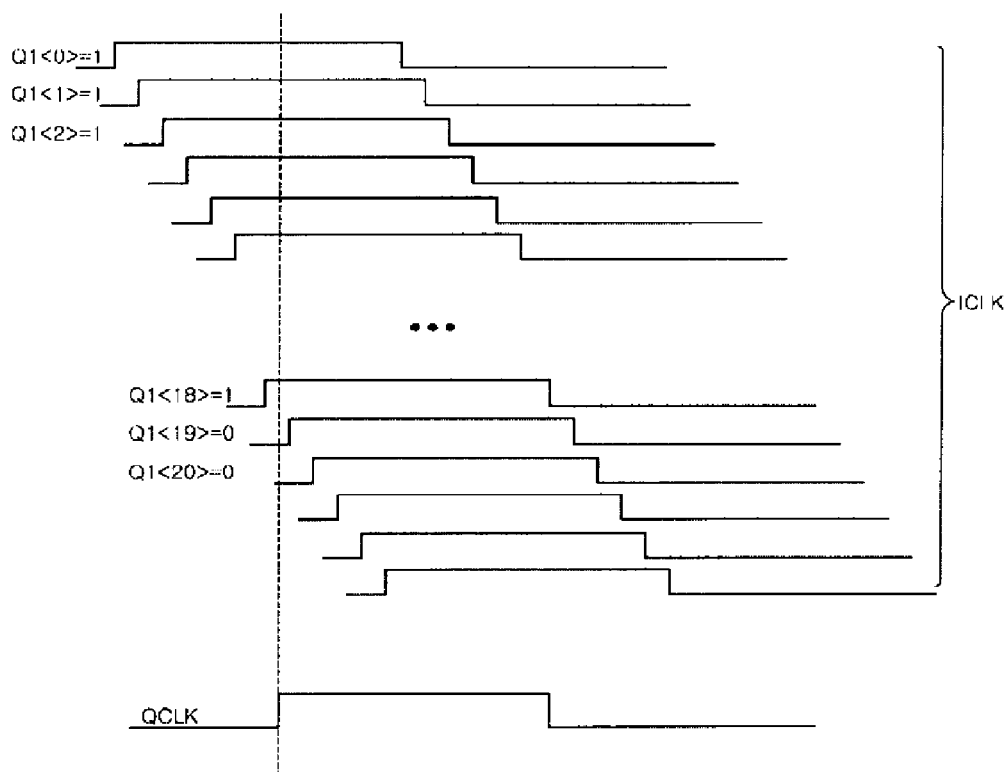
FIG. 4 is a diagram illustrating the output timing of the time/digital converter illustrated in FIG. 3.

As shown in FIG. 4, the first time/digital converter 410 is configured to generate the first skew detection signals Q1<0:N> by sampling the clock signal ICLK, which is sequentially delayed using the plurality of delayers DLY (412), by using the plurality of samplers 411 according to the clock signal QCLK.

The second time/digital converter 420 may have the same configuration as that of the first time/digital converter 410.

The second time/digital converter 420 is configured to generate the second skew detection signals Q2<0:N> by sampling the clock signal QCLK, which is sequentially delayed using the plurality of delayers DLY (412), by using the plurality of samplers 411 according to the clock signal ICLKB.

Figure 5:
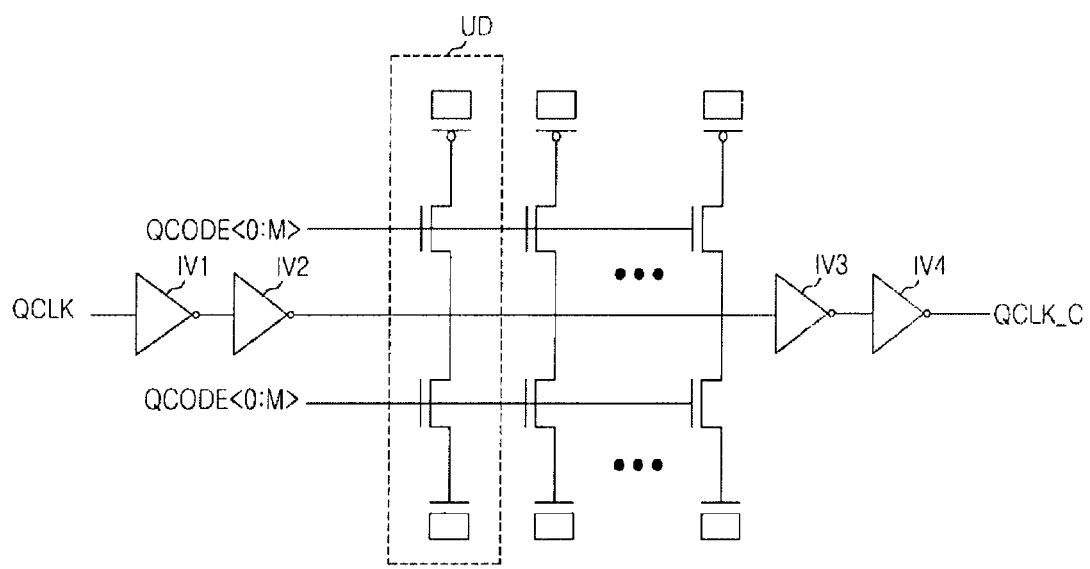
FIG. 5 is a circuit diagram of the first phase adjuster illustrated in FIG. 2.

As illustrated in FIG. 5, the first phase adjuster 610 includes a plurality of inverters IV1 to IV4 and a plurality of unit delays UD.

The unit delay UD may include a capacitor connected to a power source terminal, a capacitor connected to a ground terminal, and a plurality of transistors.

The plurality of unit delays UD use binary weighting. That is, the plurality of unit delays UD are configured to have delay time which sequentially increases or decreases and one of the plurality of unit delays UD is selected using the phase control signals QCODE<0:M>, resulting in the increase or decrease in the delay time.

The above-described configuration of the first phase adjuster 610 is for illustrative purposes and not intended to restrict the scope of the present invention.

A phase correction operation of the phase correction circuit having the above-described configuration according to an embodiment of the invention will be described below.

Referring to FIG. 4, among the first skew detection signals Q1<0:N> outputted from the first time/digital converter 410, for example, the first skew detection signals Q<0> to Q<18> have a value of '1' and the first skew detection signals Q<19> to Q<N> have a value of '0'. That is, the degree of the delay of the clock signal QCLK relative to the clock signal ICLK may be represented by a digital signal.

In the same manner, based on the second skew detection signals Q2<0:N> outputted from the second time/digital converter 420, the degree of the delay of the clock signal QCLK relative to the clock signal ICLKB may be represented by a digital signal.

If the clock signals ICLK, QCLK, and ICLKB were to have a phase difference of exactly 90° therebetween, the first skew detection signals Q1<0:N> and the second skew detection signals Q2<0:N> would have the same value, and the difference between the first and second skew detection signals Q1<0:N>, Q2<0:N> would equal to '0'.

However, when the phase difference between the clock signals ICLK and QCLK is not 90°, the first skew detection signals Q1<0:N> and the second skew detection signals Q2<0:N> would have different values, and the difference value between the first and second skew detection signals Q1<0:N>, would be a value not equal to '0'.

For example, when the first skew detection signals Q1<0:N> have a value larger than that of the second skew detection signals Q2<0:N>, the delay time of the second phase adjuster 620 is allowed to be shorter than that of the first phase adjuster 610.

Meanwhile, when the first skew detection signals Q1<0:N> have a value smaller than that of the second skew detection signals icy Q2<0:N>, the delay time of the second phase adjuster 620 is allowed to be longer than that of the first phase adjuster 610.

The phase control signal generation unit 500 includes an encoding logic to adjust the delay time of the first to fourth phase adjusters 610, 620, 630, and 640 according to the above-described principle.

Thus, the phase control signal generation unit 500 is configured to generate the phase control signals QCODE<0:M> by encoding a result obtained by subtracting the second skew detection signals Q2<0:N> from the first skew detection signals Q1<0:N>.

Furthermore, the phase control signal generation unit 500 is configured to output the phase control signals QBCODE<0:M> having the same value as that of the phase control signals QCODE<0:M>, and output the phase control signals IBCODE<0:M> and ICODE<0:M> having the preset value.

The phase adjustment unit 600 is configured to output the phase adjustment signals ICLK_C, QCLK_C, ICLKB_C, and QCKLB_C by delaying the 4-phase clock signals ICLK, QCLK, ICLKB, and QCKLB by the delay time which has been set by the phase control signals QCODE<0:M>, QBCODE<0:M>, ICODE<0:M>, and IBCODE<0:M>.

Figure 6:
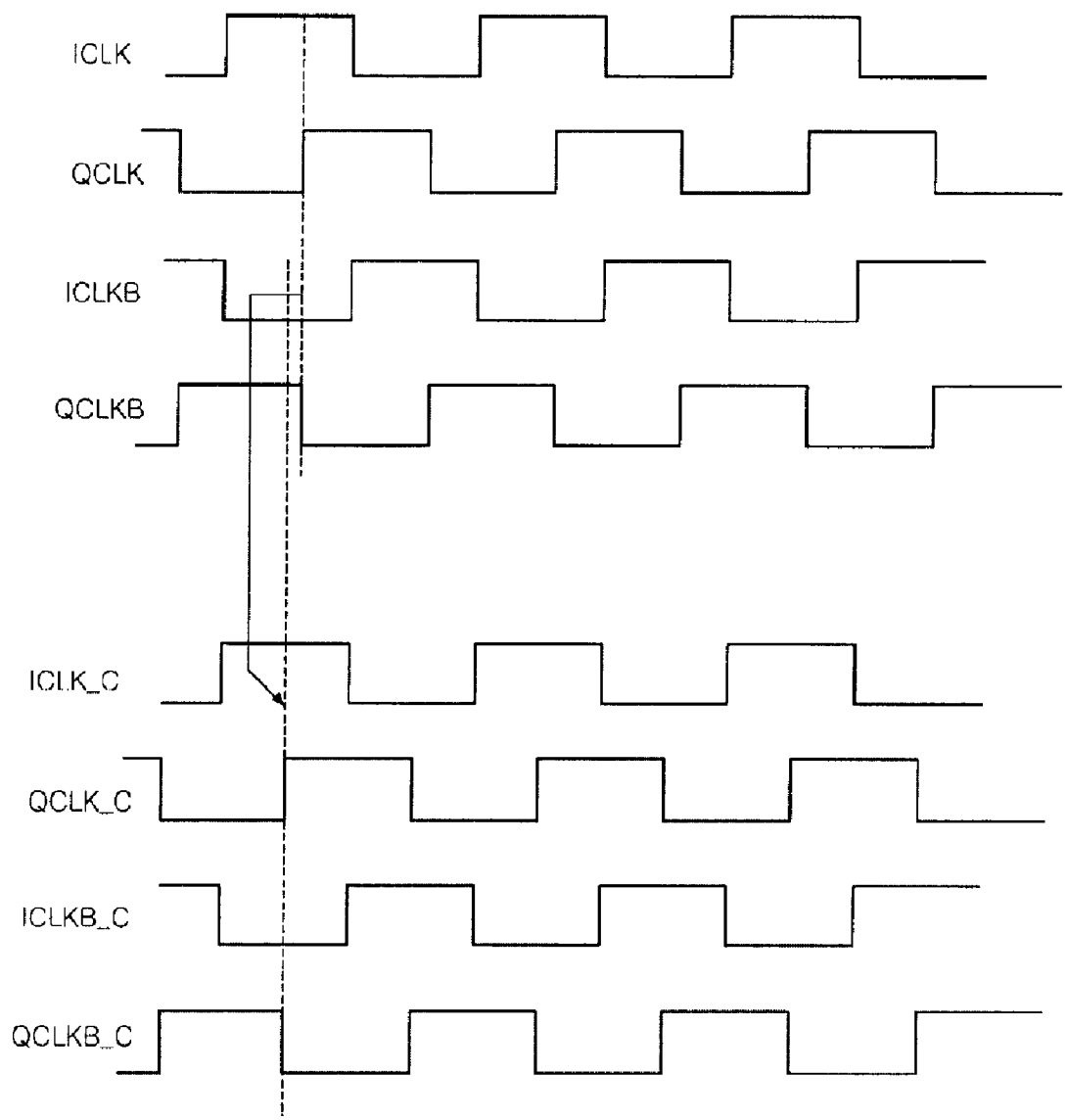
FIG. 6 is a diagram illustrating the output timing of a phase correction circuit according to an embodiment of the present invention.

Thus, as illustrated in FIG. 6, the phases of the phase adjustment signals QCLK_C and QCKLB_C are corrected, so that the phase adjustment signals ICLK_C, QCLK_C, ICLKB_C, and QCKLB_C would have a phase difference equal or substantially equal to 90° therebetween.

The phase adjustment signals ICLK_C, QCLK_C, ICLKB_C, and QCKLB_C have been substantially delayed as compared to the 4-phase clock signals ICLK, QCLK, ICLKB, and QCKLB. However, FIG. 6 illustrates the phase adjustment signals ICLK_C, QCLK_C, ICLKB_C, and QCKLB_C and the 4-phase clock signals ICLK, QCLK, ICLKB, and QCKLB at the same timing in order to easily describe the phase correction.

A DRAM such as a GDDR5 DDR SDRAM includes a duty cycle corrector (DCC) in order to correct a duty cycle.

A phase skew occurs in multi-phase signals such as 4-phase clock signals used in the GDDR5 DDR SDRAM, but the duty ratio of the multi-phase signals is constant. Therefore, the phase skew may not be corrected using the DCC.

However, according to an embodiment of the invention, the degree of a phase skew is detected and the degree of the delay of the 4-phase clock signals is adjusted according to the detected degree of the phase skew, so that it is possible to correct the phases of the 4-phase clock signals.

According to an embodiment of the invention, a phase difference between multi-phase signals is detected and corrected according to a target value, so that it is possible to minimize reduction in the set up margin or hold margin of a circuit that performs signal processing using the multi-phase signals.

While certain embodiments have been described above, it will be understood to those skilled in the art that the embodiments described are by way of example only. Accordingly, the phase correction circuit described herein should not be limited based on the described embodiments. Rather, the phase correction circuit described herein should only be limited in light of the claims that follow when taken in conjunction with the above description and accompanying drawings.

What is claimed is:

1. A phase correction circuit comprising:
   a skew detection unit configured to generate first skew detection signals and second skew detection signals by comparing multi-phase signals with one another;
   a phase control signal generation unit configured to generate a plurality of phase control signals by combining the first skew detection signals with the second skew detection signals; and
   a phase adjustment unit configured to delay the multi-phase signals by a delay time corresponding to the plurality of the phase control signals,
   wherein the multi-phase signals comprise first to third phase signals,
   wherein the skew detection unit comprises:
   a first time/digital converter configured to generate the first skew detection signals by sampling the second phase signal on a basis of the first phase signal; and
   a second time/digital converter configured to generate the second skew detection signals by sampling the first phase signal on a basis of the third phase signal.

2. The phase correction circuit according to claim 1, wherein the skew detection unit is configured to generate the first skew detection signals and the second skew detection signals by comparing the first phase signal with both the second phase signal having an advanced phase with respect to the first phase signal and a third phase signal having a delayed phase with respect to the first phase signal.

3. The phase correction circuit according to claim 1, further comprising:
   a first delay section configured to delay the second phase signal and provide a delayed second phase signal to the first time/digital converter; and
   a second delay section configured to delay the first phase signal and provide a delayed first phase signal to the second time/digital converter.

4. The phase correction circuit according to claim 1, wherein the first time/digital converter comprises:
   a plurality of delayers configured to sequentially delay the second phase signal; and
   a plurality of samplers configured to sample output of the plurality of delayers according to the first phase signal.

5. The phase correction circuit according to claim 1, wherein the second time/digital converter comprises:
   a plurality of delayers configured to sequentially delay the first phase signal; and
   a plurality of samplers configured to sample output of the plurality of delayers according to the third phase signal.

6. The phase correction circuit according to claim 1, wherein the phase control signal generation unit is configured to generate the plurality of the phase control signals by encoding difference values of the first skew detection signals and the second skew detection signals.

7. A phase correction circuit comprising:
   a skew detection unit configured to generate first skew detection signals and second skew detection signals by sampling a sequentially delayed second phase signal on a basis of a first phase signal of 4-phase signals and sampling a sequentially delayed first phase signal on a basis of a third phase signal of the 4-phase signals;
   a phase control signal generation unit configured to generate phase control signals by combining the first skew detection signals with the second skew detection signals; and
   a phase adjustment unit configured to correct a phase difference between the 4-phase signals by delaying the first phase signal and a fourth phase signal by a delay time corresponding to the phase control signals,
   wherein the skew detection unit comprises:
   a first time/digital converter configured to generate the first skew detection signals by sampling the second phase signal on the basis of the first phase signal; and a second time/digital converter configured to generate the second skew detection signals by sampling the first phase signal on the basis of the third phase signal.

8. The phase correction circuit according to claim 7, further comprising:
a first delay section configured to delay the second phase signal and provide a delayed second phase signal to the first time/digital converter; and
a second delay section configured to delay the first phase signal and provide a delayed first phase signal to the second time/digital converter.

9. The phase correction circuit according to claim 7, wherein the first time/digital converter comprises:
a plurality of delayers configured to sequentially delay the second phase signal; and
a plurality of samplers configured to sample output of the plurality of delayers according to the first phase signal.

10. The phase correction circuit according to claim 7, wherein the second time/digital converter comprises:
a plurality of delayers configured to sequentially delay the first phase signal; and
a plurality of samplers configured to sample output of the plurality of delayers according to the third phase signal.

11. The phase correction circuit according to claim 7, wherein the phase adjustment unit comprises:
a first phase adjuster configured to delay the first phase signal by the delay time corresponding to the phase control signals;
a second phase adjuster configured to delay the second phase signal by preset time;
a third phase adjuster configured to delay the third phase signal by the preset time; and
a fourth phase adjuster configured to delay the fourth phase signal by the delay time corresponding to the phase control signals.

12. The phase correction circuit according to claim 11, further comprising a register configured to store a separate phase control signal for setting the preset time.

* * * * *